(12) United States Patent
Yao et al.

(10) Patent No.: US 6,411,214 B1
(45) Date of Patent: *Jun. 25, 2002

(54) METHOD FOR SENSING ELECTRICAL CURRENT

(75) Inventors: Jun Jason Yao, Thousand Oaks; Gerard J. Sullivan, Newbury Park; Robert J. Anderson, Thousand Oaks, all of CA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/675,861

(22) Filed: Sep. 29, 2000

Related U.S. Application Data

(63) Continuation of application No. 09/406,364, filed on Sep. 28, 1999, now Pat. No. 6,188,322.

(51) Int. Cl.⁷ ............................................. G08B 21/00
(52) U.S. Cl. ................... 340/664; 340/686.1; 324/658; 324/684
(58) Field of Search ................ 340/664, 660, 340/657, 686.1; 324/207.13, 658, 684

(56) References Cited

U.S. PATENT DOCUMENTS

| | | | | |
|---|---|---|---|---|
| 5,983,712 A | * | 11/1999 | Lindsay et al. | ................ 73/105 |
| 6,005,383 A | * | 12/1999 | Savary et al. | ................ 324/127 |
| 6,184,672 B1 | * | 2/2001 | Berkcan | ................ 324/117 R |
| 6,188,322 B1 | * | 2/2001 | Yao et al. | ................ 340/644 |

* cited by examiner

*Primary Examiner*—Daniel J. Wu
(74) *Attorney, Agent, or Firm*—Patrick S. Yoder; Alexander M. Gerasimow; R. Scott Speroff

(57) ABSTRACT

A method is provided for sensing and measuring an electrical current. The current to be measured is applied to a deflectable member in a sensing module in the presence of a magnetic field. Deflection of the member is detected as an indication of the current. A nulling current may be applied to one or more additional deflectable members mechanically linked to the deflectable member. Feedback or readout signals indicative of deflection of the members are monitored. The nulling current is modulated to drive the feedback signals to a desired level. The nulling current value is converted to a value representative of the current to be measured.

37 Claims, 3 Drawing Sheets

METHOD FOR SENSING ELECTRICAL CURRENT

This application is a continuation of Ser. No. 09/406,364 filed Sep. 28, 1999, U.S. Pat. No. 6,188,322.

BACKGROUND OF THE INVENTION

1. Field of the Invention

The present invention relates generally to the field of electrical current sensing devices such as those used in programmable logic controllers and other environments. More particularly, the invention relates to a method for sensing current through the use of a high resolution electromechanical device which can be formed through micromachining and similar techniques and incorporated into control, monitoring and similar circuits.

2. Description of the Related Art

A wide range of applications exist for devices capable of accurately sensing electrical current. In certain applications, current is sensed for simple readout, such as on a metered scale or digital display. A considerable number of applications, however, require current to be sensed for use in regulation of power or as feedback for the control of machines, circuits, and processes.

In the industrial environment, for example, feedback devices and actuators typically operate within specified current and voltage ranges. Feedback from sensors may assume values within the acceptable range, with the values reflecting physical parameters of a controlled system. One such application is in programmable logic controllers (PLC's) in which a 4–20 ma current range is typically provided for control and feedback. To enhance the performance of systems incorporating these devices, it is often desirable to obtain very high resolution current sensing in a manner which avoids unnecessary power drain from the associated circuitry or system.

Digital current sensors presently in use in applications such as PLC's suffer from several drawbacks. In certain known 4–20 ma current sensors, for example, isolation from perturbations which may be caused by external circuitry is achieved by electrically "floating" an analog-to-digital converter and its associated electronics. This involves a floating power supply circuit which uses a DC-to-DC converter which receives an input from a 5 volt DC power supply, converts it to an AC signal, transforms the AC signal for isolation, and reconverts the AC signal into DC power. The isolated electronics then communicate with non-isolated electronics through a pair of digital opto-isolators. These isolators are then coupled to a clock and to an output which returns digital values in serial form. However, opto-isolators used in such devices are, in general, unsuitable for use in an analog fashion for resolutions higher than 6–8 bits, due to their temperature dependency and drift. Moreover, to reduce costs in such sensor circuitry, analog inputs for a single module are generally not isolated from one another so that they can share a same floating power supply.

An important drawback in present state-of-the-art current sensors is their unit cost. Even in applications where a single current sensor suffices for feedback or control, sensors of the type described above can add significantly to the overall system price. Moreover, in many PLC applications, it is desirable to provide current sensors on many or all outputs of a PLC to monitor output current for system control, as well as for diagnostic monitoring, such as for output protection. As noted above, similar high resolution, low cost requirements exist for sensing on input channels of PLC's and other devices.

Still further drawbacks in existing technologies include inconsistencies in device-to-device performance, in compatibility with microelectronics, parasitic losses, and the physical dimensions of the current sensor and associated circuitry. These and the foregoing drawbacks can further lead to problems with energy dissipation, heating and other thermodynamic and performance problems.

There is a need, therefore, for an improved technique for providing high resolution current sensing at a relatively low cost for both the sensing device and its associated circuit. There is, at present, a particular need for a current sensing technique which offers enhanced performance in a reduced package size, facilitating both manufacturing and incorporation into electrical and microelectronic devices such as PLC's.

SUMMARY OF THE INVENTION

The present invention provides a current sensing technique designed to respond to these needs. The technique is particularly well suited to floating current sensing, such as in a floating current input stage or an output stage of a PLC. However, the technique may be used in a wide range of devices, both for control, feedback and monitoring functions. The technique employs microelectro-mechanical systems (MEMS) features to form a small, cost effective unit which may be employed in single modules or in module arrays.

In accordance with certain aspects of the method, a basic module on which the method is practiced includes a deflectable member disposed in a magnetic field. In the method, a current to be measure or sensed is applied to the deflectable member, urging the deflection of the member by interaction of the magnetic field with the electromagnetic field produced by the flowing current. One or more feedback or readout devices are coupled to the deflectable member. Signals from the feedback or readout device provide an indication of the level of current applied to the deflectable member. The feedback or readout device may include a capacitor, output voltage of which varies with deflection of the member.

The method may be employed either in an open loop or closed loop setting. In an closed loop implementation, a pair of additional deflectable members flank the deflectable member to which the sensed current is applied. These additional members are mechanically linked to the sensed current member. Feedback devices, such as micromachined capacitors, may be provided on either side of the additional deflectable members. Nulling or compensating currents may be passed through the additional deflectable members to counter the deflection of the sensed current member. By driving the feedback to a null level or into a known tolerance range, the current applied to the sensed current member is determined based upon the level of the nulling current. In an open loop configuration, the output of one or more readout devices, such as micromachined capacitors, may be evaluated directly to provide an indication of the sensed current. Alternative readout devices may include optical output devices or piezoelectric devices.

The technique provides significantly enhanced resolution as compared to heretofore known devices. For example, the method may provide output resolution of 42–16 bits over an operating range of 4–20 ma. It does not require a floating power supply, and analog inputs from single modules may be isolated from one another without additional expense. Where desired, the method may include sensing via arrays of large numbers of the modules for enhanced performance, higher current levels, and so forth.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
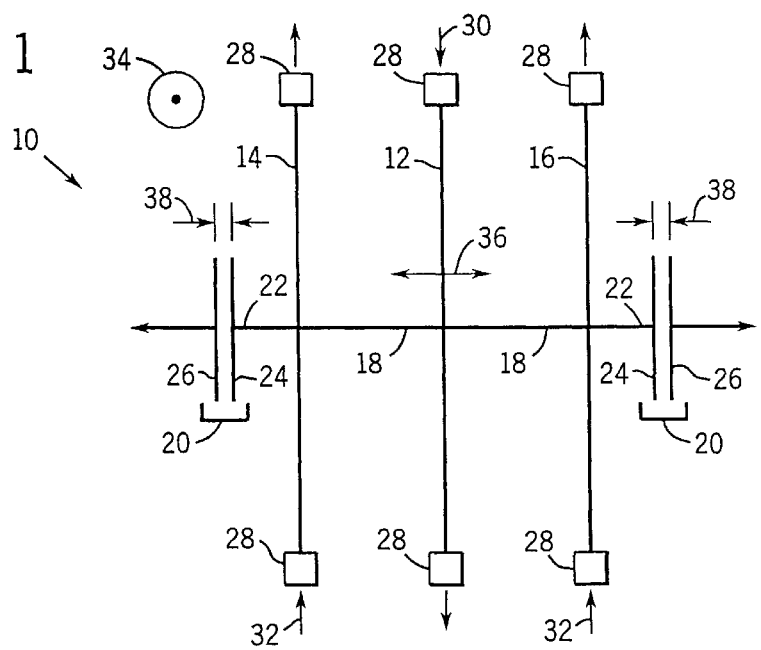
FIG. 1 is a diagrammatical representation of a current sensor employing the present technique for measuring current through a closed loop arrangement.

Turning now to the drawings, and referring first to FIG. 1, a current sensing module 10, in accordance with certain aspects of the present invention, is illustrated diagrammatically. The current sensing module of FIG. 1 is designed to receive both a sensed or to be measured current and a nulling current, and to produce signals indicative of balance between the measured and nulling currents. As described below, the device may be adapted to measure current directly without nulling, in an open-loop manner. The closed-loop configuration of FIG. 1, however, includes a measurement beam 12 flanked by a pair of nulling beams 14 and 16. Beams 12, 14 and 16 are deflectable by virtue of their inherent elasticity under the influence of electric currents flowing in the presence of a magnetic field.

Measurement beam 12 and nulling beams 14 and 16 are mechanically coupled to one another by a pair of connecting members 18. Connecting members 18 permit forces tending to deflect beams 12, 14 and 16 to coact so as to cause deflection of all of the beams under combined forces exerted on each as described below. In the illustrated embodiment, a pair of feedback or readout devices in the form of capacitors 20 are provided for measuring relative deflection of the system defined by beams 12, 14 and 16, and by connecting members 18. Each of the capacitors is linked to the system by additional connecting members 22.

Each capacitor 20 includes a pair of electrodes 24 and 26. Electrode 24 is linked to connecting member 22 and moves with the deflectable system defined by beams 12, 14 and 16. As described more fully below, while connecting members 18 electrically isolate beams 12, 14 and 16, connecting members 22 electrically couple beams 14 and 16 to respective electrodes 24 of each capacitor so as to maintain the same electrical potential within beams 14 and 16, and electrodes 24. Electrode 26 is maintained stationary within each capacitor.

Beams 12, 14 and 16 are configured to receive electrical currents for the measurement technique described below. Thus, each beam is provided with a pair of conductive terminal pads 28, with one pad being provided at each end thereof. Terminal pads 28 are made of a conductive material such that current may be channeled through the beams. In the embodiment illustrated in FIG. 1, a current to be measured is applied to measurement beam 12 as indicated by arrow 30. A compensating or nulling current is applied to beams 14 and 16 as indicated by arrows 32. The currents are applied in the presence of a uniform magnetic field, as indicated generally at reference numeral 34. By virtue of the interaction of the fields resulting from the current flow, and of the magnetic field, beams 12, 14 and 16, coupled to one another via connecting members 18, are deflected laterally as indicated by arrow 36 in FIG. 1. Moreover, electrodes 24 and 26 of each feedback capacitor 20 are spaced from one another by a distance 38 which varies as the beams are deflected. The variation in the gaps 38 of each capacitor thus result in changes in electrical potential sensed at electrodes 26. As described more fully below, by providing inverted polarities between the currents flowing through the measurement and nulling beams, and by monitoring output from the feedback devices, the current applied to measurement beam 12 is detected either in open or closed loop techniques.

Figure 2:
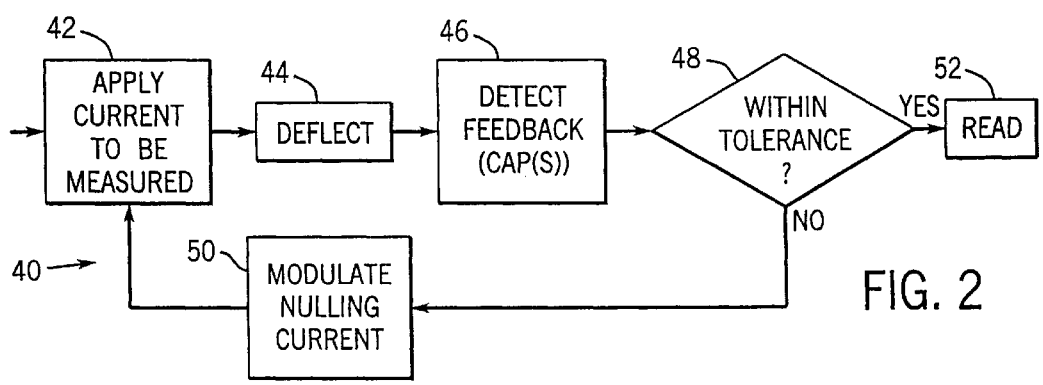
FIG. 2 is a block diagram indicating exemplary logical steps in closed loop current sensing employing a structure such as that represented in FIG. 1.

FIG. 2 represents exemplary control logic for sensing and measuring current in the device illustrated in FIG. 1 in accordance with a closed loop technique. The control logic, designated generally by reference numeral 40, begins at step 42 wherein the current to be measured is applied to the deflectable member or measurement beam 12. As noted above, the current is applied in a first known polarity by terminating the device at pads 28 of beam 12. As current flows through beam 12, the beam is urged to deflect as indicated at block 44 of FIG. 2. This deflection is generally governed by factors such as the flux density of magnetic field 34, the current through beam 12, generating a field in accordance with the right-hand rule which is a function of the current, and the mechanical rigidity of the beam system. As this current is applied, electrical potential is sensed from capacitors 20 as a feedback signal, as indicated at block 46. At block 48, a control circuit coupled to the sensor module determines whether the feedback signal is within a desired tolerance. This tolerance may be a given ratio of the potentials between capacitors 20 on either side of the module, or a given percentage of a known or calibrated potential. If the beam system is deflected more than the desired tolerance, the response to block 48 will be negative, resulting in modulation of nulling currents applied to beams 14 and 16, as indicated at block 50.

As the nulling or compensation current is applied to beams 14 and 16, in a polarity opposite that of the measured current applied to beam 12, the beam system will be urged back to a non-deflected position by interaction of fields generated about beams 14 and 16 and the magnetic field 34. By modulating the nulling current in this closed loop manner, the deflection of the beam system is driven to a level at which feedback from capacitors 20 falls within a desired tolerance or dead band. At this point of balance, the nulling or compensation current is read, as indicated at block 52 in FIG. 2, to provide an indication of the current to be measured. As will be apparent to those skilled in the art, calibration of module 10 permits nulling or compensation currents to be translated into values representative of the measured current due to the physical properties of the beam system.

The output voltage of the feedback capacitors of the embodiment of FIG. 1 may be defined by the relationship:

$$V_{out} = \left[\frac{V_1 + V_2}{2} + \frac{V_1 - V_2}{2}\right]\frac{\Delta\varepsilon}{C},$$

Where C is the structural capacitance, $\Delta C$ is the change in the capacitance due to deflection of the beam system, and $V_1$ and $V_2$ are the voltages applied to the capacitor electrodes. If $V_1$ and $V_2$ are 180° out of phase with one another, the output voltage may be expressed:

$$V_{out} = \left[\frac{V_1 + V_2}{2}\right]\frac{\Delta\varepsilon}{C}.$$

Where two nulling or compensating beams are provided, the measured current will generally equal twice the nulling current when the value $V_{out}$ approaches zero ($\Delta C=0$). The system may be further calibrated to account for any mechanical or electronic variations or tolerances, where desired.

It should be noted that the input impedance of the current sensor described above is small due to the input current flowing through a metal conductor. All measurements are performed in the closed loop embodiment by the nulling current. Moreover, the input current is electrically isolated at the input stage (at terminal pads 28 of the measurement beam) and is mechanically coupled to the remainder of the device components. Thus, the structure permits the elimination of the floating power supply of heretofore known sensors. Where a number of modules are employed, as described below, inputs of each module are easily isolated from one another.

By employing the nulling current technique to actively cancel the electromagnetic force generated by application of the input or measured current, the magnitude of the magnetic field applied to the device need not be precisely known. That is, the influence of the magnetic field on both the sensing and nulling beams of the closed loop technique effectively cancel the field strength term in the mathematical description of the system. Consequently, any magnetic field noise, such as earth magnetic field or fields generated by nearby machines, will not generally affect the accuracy of the current sensor. Rather, sensitivity oft he current sensor will generally be enhanced by increases in the total magnetic field perpendicular to the beam system.

The structure and technique for closed loop sensing is also enhanced by the provision of nulling beams flanking either side of the sensing beam. For example, the favored structure minimizes mechanical torque on the system by balancing forces on either side of the measurement beam. Similarly, temperature variations on the various beams, connecting members, and support structures will typically affect the entire system in a fairly uniform and compensating manner.

Figure 3:
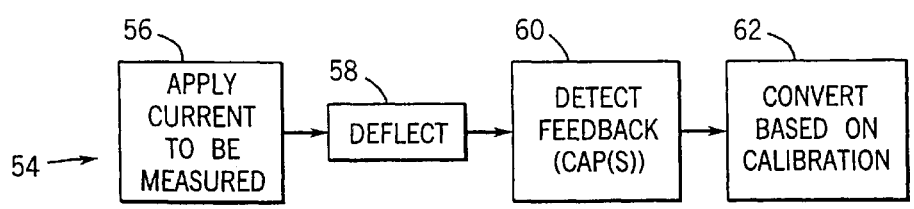
FIG. 3 is a similar block diagram of an open loop technique for sensing current.

FIG. 3 illustrates exemplary control logic for measuring current through a simplified open loop technique. This control logic, designated generally by reference numeral 54 in FIG. 3, may be applied to a device like that shown in FIG. 1, or to a simplified device wherein a measurement beam 12 is coupled directly to one or more readout devices, such as a capacitor 20 of the type shown in FIG. 1. In the open loop method, the current to be measured is applied to the deflectable beam 12 as indicated at block 56. Again, the current is applied in the presence of the magnetic field 34. Depending upon the flux density of the field, the current level, and the rigidity of the deflectable beam system, beam 12 is caused to deflect as indicated at block 58, resulting in variation of a gap 38 within the capacitor readout device. The output of the device is detected at block 60, and converted at block 62.

As in the previous technique, the output of the readout device or devices may be converted to a value representative of the measured current based upon calibrated conversion factors which will be a function of the magnetic field strength, the measured current values, and the mechanical properties of the deflectable beam system.

Figure 4:
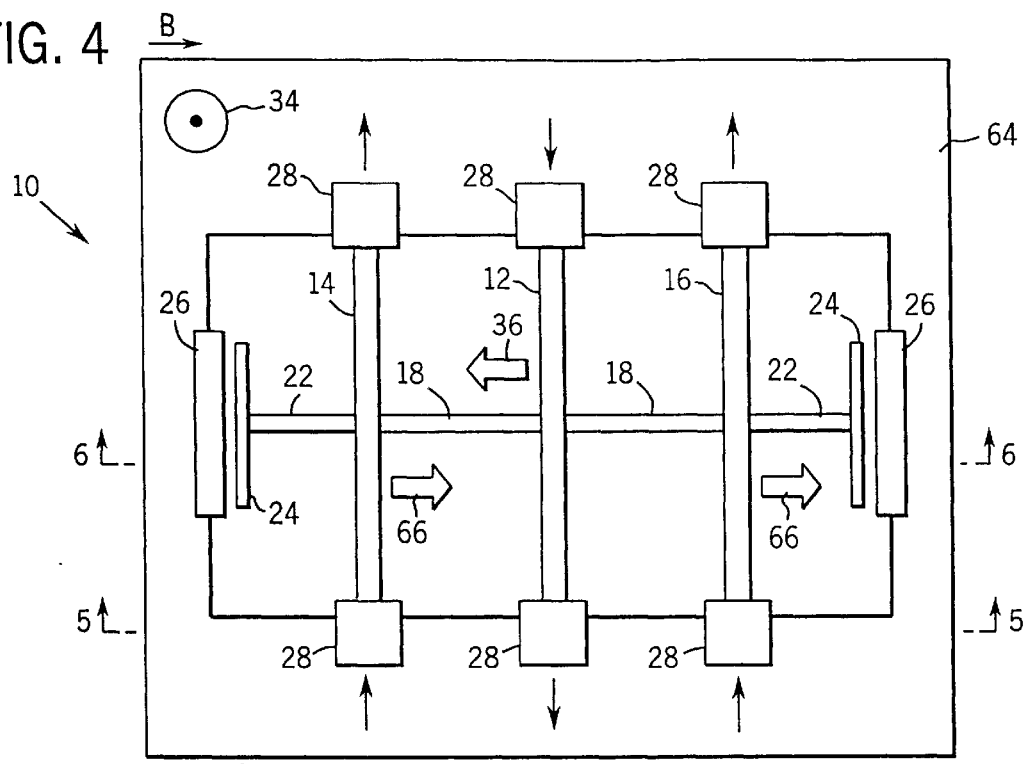
FIG. 4 is a physical diagram of an exemplary MEMS current sensor of the type illustrated in FIG. 1.
Figure 5:
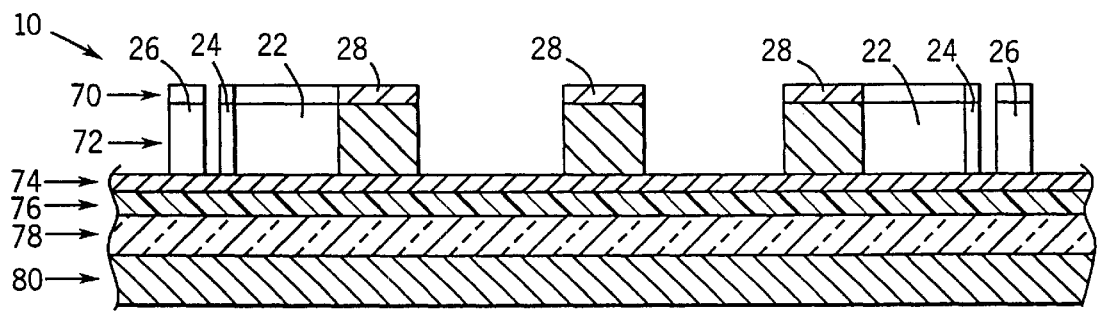
FIG. 5 is a sectional view of the sensor of FIG. 4 taken along line 5—5.
Figure 6:
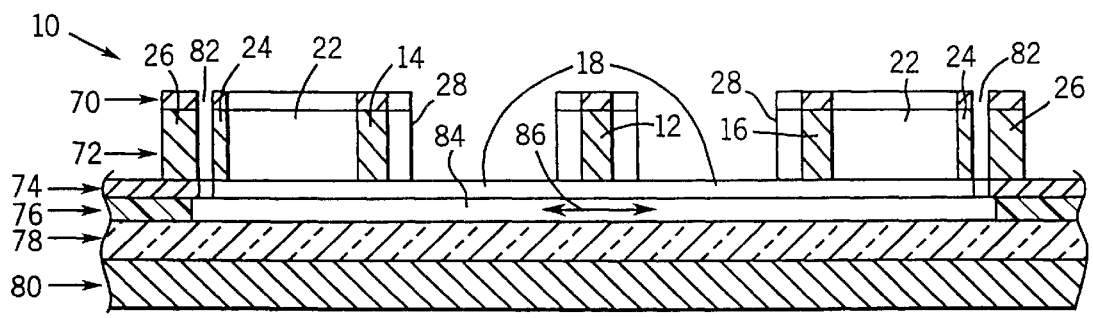
FIG. 6 is a sectional view of the sensor of FIG. 4 taken along line 6—6.

FIGS. 4, 5 and 6 illustrate a presently preferred physical implementation of the current sensing module 10 described above. As mentioned with respect to FIG. 1, the module includes deflectable members 12, 14 and 16 supported for lateral movement. Ends of each member are supported by posts at which terminal pads 28 are provided. Mechanical connecting members 18 extend between the deflectable beams for maintaining a uniform movement of the beams under the influence of applied currents. Additional connecting members 22, preferably including conductive elements as described below, extend between the nulling or compensating beams 14 and 16, and an electrode 24 of each feedback device. The other electrode 26 of each feedback or readout device is fixed in the module and is coupled to external circuitry (not shown).

The foregoing structures are provided on a substrate 64. Moreover, the various components of the module 10 may be formed on the substrate by adding successive layers of desired materials, and removing regions of certain of the layers in MEMS processing steps. In the resulting structure, then, beam 12, and other elements of the deflectable system, will react to currents by deflecting as indicated at arrow 36. Forces tending to cause such deflection are opposed by oppositely-oriented forces on the nulling or compensating beams 14 and 16, as indicated at arrows 66 in FIG. 4.

FIG. 5 illustrates an exemplary layered configuration of the module 10 shown in FIG. 4, taken along line 5—5. In the illustrated embodiment, successive layers form the components described above, including a conductive layer 70, a structural layer 72, an insulating layer 74, an epoxy layer 76, a glass layer 78, and a magnet layer 80. Layers 70, 72 and 74 combine to form a device layer, in which the deflectable beam structure, feedback or readout devices, and terminal pads are provided. Layers 76, 78 and 80, in turn, form a substrate on which the device layer is supported. In a presently preferred embodiment, metal layer 70 is formed of a highly conductive metal, such as aluminum or copper. Layer 72 is made of a structural material adding to the mechanical integrity and desired rigidity of the system. In the present embodiment, layer 72 is made of silicon or polysilicon. Insulting layer 74, which generally serves to form a base of the device layer, and to link the deflectable members to one another, is made of $SiO_2$. Layer 76 comprises a suitable epoxy interposed between insulating layer 74 and glass layer 78. Glass layer 78, in turn, is made of a suitable insulating glass material of relatively low coefficient of thermal expansion. Such material is commercially available under the tradename Vycor. Finally, magnet layer 70 may be made of any suitable magnetic material capable of creating the field described above. For example, magnet layer 80 may be made of a magnetic material impregnated polymer.

FIGS. 5 and 6 illustrate the layered structure described above, including the features defining the sensor components. As shown in FIG. 5, the layered structure is preferably built by a series of assembly and deposition steps beginning with silicon layer 72 (e.g. 3 $\mu$m thickness), the $SiO_2$ layer 74, the epoxy layer 76, the glass layer 78, and the magnet layer 80. With the additional conductor layer 70 disposed thereon (e.g. <1 $\mu$m thickness), the resulting structure is subsequently etched to define the spaces or gaps illustrated in FIG.

5 between the terminal pads 28, the underlying beam structures and support posts, and electrodes 24 and 26.

At best illustrated in FIG. 6, the etching process, is continued to permit deflection or flexibility in the beam structure of the sensor module. In particular, a cavity is etched into epoxy layer 76, such as completely to glass layer 78, forming openings or gaps 82 between electrodes 24 and 26. These gaps, which serve to define the variable gaps 38 of the module (see FIG. 1), continue to the cavity surrounded by the etched epoxy layer 76. The silicon layer 72 is similarly etched to the glass layer 78, to form a cavity extending to the gaps 82. However, the photoresist and etching process is adapted to etch below connecting members 18, while leaving the connecting members intact and extending between beams 12,14 and 16.

In the resulting structure, the beam system is supported, yet deflectable under the influence of the applied currents and magnetic field, which is preferably oriented perpendicular to the plane of the deflectable beams. In particular, as best illustrated in FIG. 6, the beams are linked to one another by connecting members 18 in the $SiO_2$ layer 74, and are suspended above cavity 84, being supported on the columns created below terminal pads 28 (see FIG. 4). The entire structure, then, may be displaced laterally as indicated by arrow 86 in FIG. 6. It should also be noted in FIGS. 5 and 6, that in the illustrated embodiment the conductive layer 70 is contiguous over beams 14 and 16, connecting members 22 and electrodes 24. Thus, when placed in operation, electrodes 24 remain at a common electrical potential with beams 14 and 16.

Figure 7:
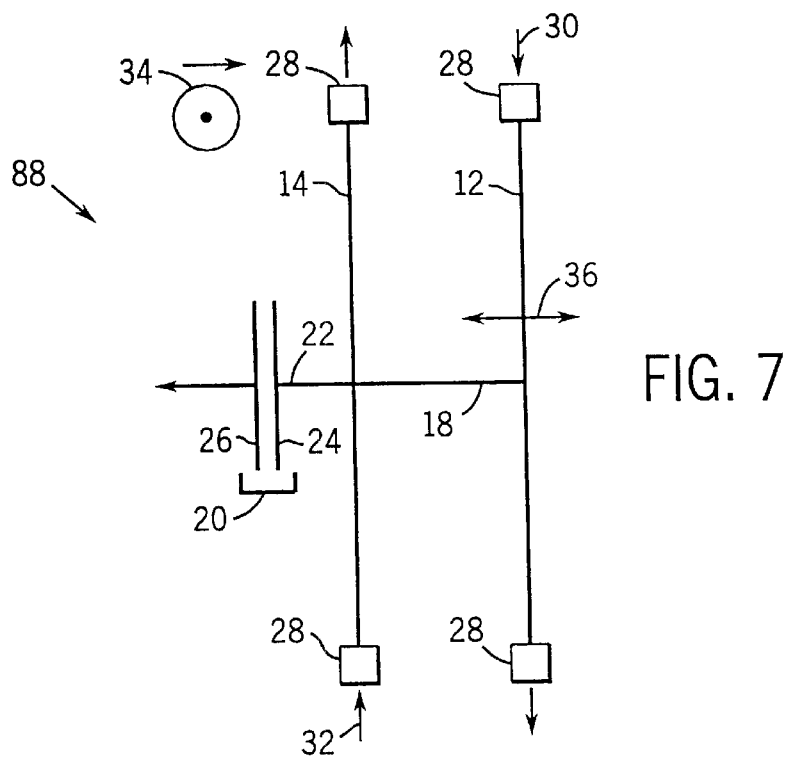
FIG. 7 is a diagrammatical representation of a current sensor employing a single nulling member and a single feedback device.
Figure 8:
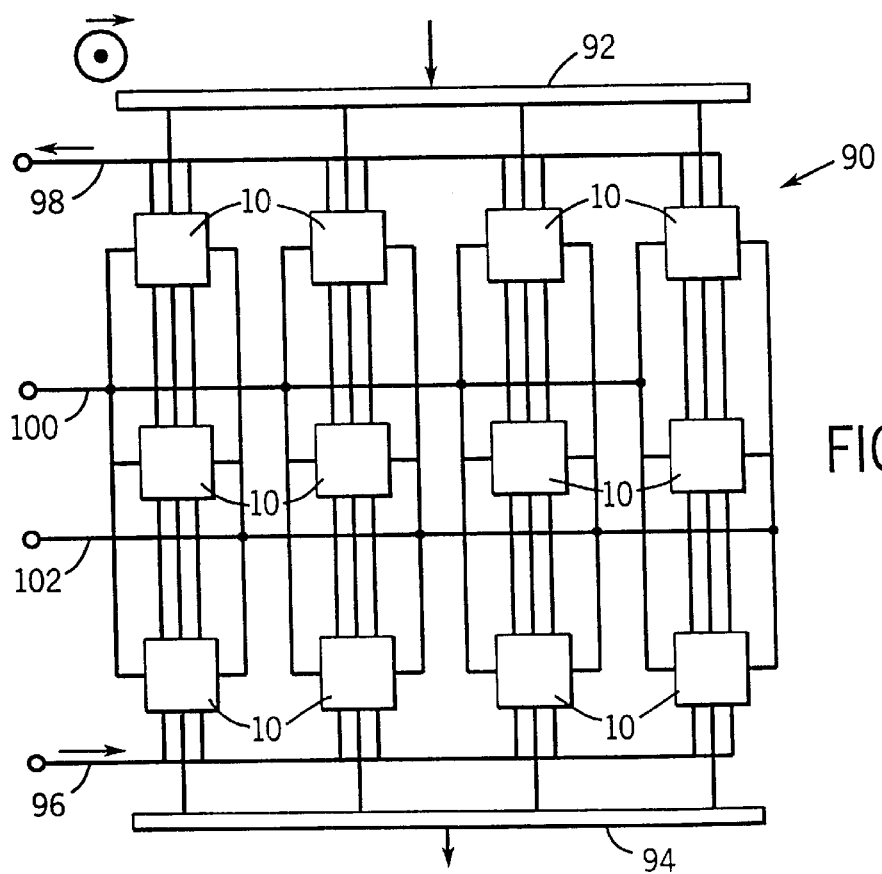
FIG. 8 is a diagrammatical representation of an array of current sensing modules coupled to one another for measurement of a single current with a single feedback or output.

As noted above, various modifications can be made to the foregoing structure, both reducing the number of components, or increasing the number of sensing modules. FIGS. 7 and 8 illustrate two such variations. In the alternative embodiment of FIG. 7, a simplified sensing module, designated generally by the reference numeral 88, includes a single sensing beam 12, and a single nulling or compensating beam 14. Again, both beams are provided in a magnetic field as illustrated by reference numeral 34. Also, both beams are provided with terminal pads 28 for completing electrical connections used to place the circuitry in a sensing device. A single feedback device, such as capacitor 20, may be employed in the structure, again coupled to the beam system by an appropriate connecting member 22. It should be noted that other alternative structures may be envisaged, such as structures in which the feedback device is mechanically coupled to the sensing beam 12, and structures in which the feedback device is separately powered, such as at a known electrical potential different from that applied to beam 14.

FIG. 8 illustrates an array of current sensors defining a sensing package, designated generally by the reference numeral 90. Package 90 includes an array of sensing modules 10 of the type described above. In the illustrated embodiment, 12 such modules are provided, although the number of sensing modules may, of course, vary depending upon such factors as the level and nature of the current to be sensed, and the accuracy or resolution desired. In the illustrated package, a current input bus 92 is provided and linked to each of the modules in the array. A current output bus 94 is provided, similarly linked to the modules. Buses 92 and 94 serve to apply the current to be sensed. Similar buses 96 and 98 are provided for the nulling or compensating current. As noted above, for closed loop current sensing, such nulling or compensating currents may be provided for controlling deflection of the sensor beam systems as an indication of the measured current. Finally, feedback buses 100 and 102 are provided and are linked to the feedback devices within each module 10.

The foregoing embodiments are preferably manufactured by MEMS techniques of the type described above. In a presently preferred manufacturing sequence, a large number of such devices may be fabricated on single crystal silicon wafers to form the layered structure described, employing deposition, etching or other machining steps to define the components of the current sensing modules. Following such fabrication, the modules are separated and may be incorporated into current sensing, control, and other circuits or circuit packages, with connections to the terminal pads 28 being established by any suitable process, such as wire bonding. Moreover, where desired, modules of the type described above, may be incorporated into integrated circuit structures with appropriate conducting traces being laid down as a part of the circuit design.

While the invention may be susceptible to various modifications and alternative forms, specific embodiments have been shown in the drawings and have been described in detail herein by way of example only. However, it should be understood that the invention is not intended to be limited to the particular forms disclosed. Rather, the invention is to cover all modifications, equivalents, and alternatives falling within the spirit and scope of the invention as defined by the following appended claims. For example, the capacitors described above could be replaced by various other feedback mechanisms formed with or added to the basic MEMS deflectable beam structure. Current applied to the feedback or readout devices may be AC or DC, although in a presently preferred embodiment two 180° out of phase AC signals are applied to the pair of capacitors described above. Moreover, alternative feedback or readout devices may include optical output devices or piezoelectric devices.

What is claimed is:

1. A method for sensing electrical current, the method comprising the acts of:
   applying a current to a deflectable sensing element, the deflectable sensing element positioned in a magnetic field; and
   sensing deflection of the deflectable sensing element and producing a readout signal representative thereof.

2. The method of claim 1, wherein the deflectable sensing element includes first and second ends and is mechanically supported at both the first and second ends.

3. The method of claim 1, wherein the deflection of the sensing element is sensed via a capacitive readout device coupled to the sensing element.

4. The method of claim 1, comprising the further step of applying a compensation current to at least one deflectable compensation element coupled to the sensing element in the presence of the magnetic field, the compensation current tending to prevent deflection of the sensing element.

5. The method of claims 4, comprising the further step of adjusting the compensation current to produce a feedback signal of a desired level.

6. The method of claim 5, wherein the feedback signal is produced by a capacitive element having an electrode at a common electrical potential with the compensation element.

7. A system for sensing electrical current, the system comprising:
   means for applying a current to a deflectable sensing element, the deflectable sensing element positioned in a magnetic field; and
   means for sensing deflection of the deflectable sensing element and producing a readout signal representative thereof.

8. The system of claim 7, wherein the deflectable sensing element includes first and second ends and is mechanically supported at both the first and second ends.

9. The system of claim 7, wherein the deflection of the sensing element is sensed via readout means coupled to the sensing element.

10. The system of claim 7, comprising the further step of applying a compensation current to at least one deflectable compensation element coupled to the sensing element in the presence of the magnetic field, the compensation current tending to prevent deflection of the sensing element.

11. The system of claim 10, comprising the further step of adjusting the compensation current to produce a feedback signal of a desired level.

12. The system of claim 11, wherein the feedback signal is produced by a capacitive element having an electrode at a common electrical potential with the compensation element.

13. An electrical current sensing device comprising:
a magnetic field;
a deflectable sensing element disposed in the magnetic field; and
a deflectable nulling element coupled to the deflectable sensing element;
wherein a current to be measured to applied to the deflectable sensing element and a nulling current is applied to the nulling element, and the nulling current is modulated to control deflection of the deflectable sensing element.

14. The electrical current sensing device of claim 13, comprising a feedback element configured to generate a feedback signal representative of deflection of the sensing element.

15. The electrical current sensing device of claim 14, wherein the feedback element includes at least one capacitive element coupled to the deflectable nulling element.

16. The electrical current sensing device of claim 15, wherein an electrode of the at least one capacitive element is configured to receive an electrical potential equal to that of the deflectable nulling element.

17. The electrical current sensing device of claim 13, wherein the nulling current is applied at a level convertible to a value representative of the current to be measured.

18. The electrical current sensing device of claim 13, wherein the nulling current is applied to a pair of nulling elements coupled to the deflectable sensing element.

19. A method for sensing an electrical current, the method comprising the steps of:
applying a current to be measured to first input and output terminals of a sensing array in a stationary magnetic field;
applying a nulling current to second input and output terminals of the sensing array; and
detecting feedback signals from a plurality of feedback devices coupled to the sensing array.

20. The method of claim 19, wherein the sensing array comprises a plurality of sensing modules having deflectable sensing members and deflectable nulling members, and wherein the deflectable nulling members are coupled to the deflectable sensing member and to the plurality of feedback devices for detecting deflection of the sensing and nulling members.

21. The method of claim 20, wherein the second input and output terminals are coupled to the nulling members of the sensing modules.

22. The method of claim 19, wherein the nulling current is modulated to drive the feedback signals to a desired level.

23. The method of claim 19, wherein a value representative of the nulling current is converted to a value representative of the current to be measured.

24. The method of claim 19, wherein the feedback signals of the plurality of sensing modules of the sensing array are detected via common busses coupled to each module.

25. The method of claim 19, comprising the step of applying a uniform magnetic field extending at least over a region occupied by the sensing array.

26. A system for measuring electrical current, the system comprising:
means for applying a current to be measured to a first deflectable member in a first polarity in the presence of a magnetic field;
means for applying a compensating current to a second deflectable member in a second polarity opposite to the first polarity in the presence of the magnetic field, the second deflectable member being mechanically linked to the first deflectable member;
means for detecting deflection of the first and second deflectable members;
means for determining the current to be measured based upon the detected deflection and the compensating current.

27. The system of claim 26, wherein the compensating current is applied to a pair of second deflectable members both linked to the first deflectable member.

28. The system of claim 26, wherein the compensating current is modulated to drive the deflection to a desire level.

29. The system of claim 26, wherein the deflection is detected via a feedback device coupled to the second deflectable member.

30. The system of claim 29, wherein the feedback device includes a capacitor.

31. The system of claim 30, wherein one electrode of the capacitor is placed at a common electrical potential as the second deflectable member.

32. A tangible medium for measuring an electrical current comprising:
a routine for applying a first current to first input and output terminals of a sensing array disposed in a magnetic field;
a routine for applying a second current to second input and output terminals of the sensing array; and
a routine for detecting feedback signals from a plurality of feedback devices, the plurality of feedback devices adapted to detect deflection in the sensing array.

33. The tangible medium as in claim 32, wherein the second current is a nulling current.

34. The tangible medium as in claim 32, comprising a routine for modulating the second current to drive the feedback signals to a desired level.

35. The tangible medium as in claim 32, comprising a routine for calculating a value representative of the current to be sensed by converting a value representative of the second current.

36. The tangible medium as in claim 32, comprising a routine for detecting feedback signals of a plurality of modules of the sensing array via a plurality of terminals coupled to each one of the plurality of modules.

37. The tangible medium as in claim 32, comprising a routine for applying a uniform magnetic field extending at least over a region occupied by the sensing array.

* * * * *